US005440241A

United States Patent [19]
King et al.

[11] Patent Number: 5,440,241
[45] Date of Patent: Aug. 8, 1995

[54] METHOD FOR TESTING, BURNING-IN, AND MANUFACTURING WAFER SCALE INTEGRATED CIRCUITS AND A PACKAGED WAFER ASSEMBLY PRODUCED THEREBY

[75] Inventors: Jerrold L. King, Boise; Jerry M. Brooks, Caldwell; Warren M. Farnworth, Nampa; George P. McGill, Boise, all of Id.

[73] Assignee: Micron Technology, Inc., Boise, Id.

[21] Appl. No.: 847,621

[22] Filed: Mar. 6, 1992

[51] Int. Cl.$^6$ .......................................... G01R 1/00
[52] U.S. Cl. ................... 324/765; 324/158.1; 324/755
[58] Field of Search ............ 324/158 R, 158 F, 73.1, 324/754, 755, 765, 72.5; 437/8; 257/48, 40; 371/15.1

[56] References Cited

U.S. PATENT DOCUMENTS

| | | | |
|---|---|---|---|
| 3,963,985 | 6/1976 | Geldermans | 324/158 F |
| 4,791,364 | 12/1988 | Kuffis et al. | 324/158 F |
| 4,899,107 | 2/1990 | Corbett et al. | 324/73.1 |
| 4,954,878 | 9/1990 | Fox et al. | 357/81 |
| 4,968,931 | 11/1990 | Littlebury et al. | 324/158 P |
| 5,124,639 | 6/1992 | Carlin et al. | 324/158 P |
| 5,172,050 | 12/1992 | Swapp | 324/158 P |
| 5,173,451 | 12/1992 | Kinsman et al. | 437/8 |
| 5,177,438 | 1/1993 | Littlebury et al. | 324/158 P |

Primary Examiner—Vinh P. Nguyen
Attorney, Agent, or Firm—William J. Bethurum; Stephen A. Gratton

[57] ABSTRACT

A method for probe testing and burning-in integrated circuits formed within dice or chips on a silicon wafer and then optionally either: (1) dicing the wafer into individual chips for shipment or (2) mating the wafer for shipment with a facing substrate having a temperature coefficient of expansion (TCE) matching the TCE of the wafer. Advantageously, the facing substrate is used for both probe and burn-in operations as well as being made a part of the wafer package in option No. 2 above where either the whole silicon wafer or a partial silicon wafer meeting threshold die requirements is to be shipped. In addition, probe and burn-in operations are carried out rapidly at high yields only after all integrated circuit manufacture has been completed.

5 Claims, 3 Drawing Sheets

METHOD FOR TESTING, BURNING-IN, AND MANUFACTURING WAFER SCALE INTEGRATED CIRCUITS AND A PACKAGED WAFER ASSEMBLY PRODUCED THEREBY

TECHNICAL FIELD

This invention relates generally to methods for testing integrated circuits (ICs) prior to shipment by the manufacturer, and more particularly to a wafer scale test and burn-in method and package assembly which operates to maximize both device yields and manufacturing options.

BACKGROUND ART

In the past, integrated circuit manufacturers have customarily used one test station for individually and sequentially probe testing each die or several dice at a time on a silicon wafer for certain of its electrical characteristics. This probe operation is carried out in order to ascertain, among other things, the percentage of chips on a wafer which operate properly. Then, the probe tested wafer was transferred to an assembly packaging area where either the entire wafer or chips diced from the wafer were packaged in preparation for a subsequent burn-in operation prior to shipment to the customer.

In another, second type of wafer scale test and burn-in procedure used, for example, by the Anamartic Company of the United Kingdom where it was desired to ship an entire silicon wafer to certain customers, wafer test and burn-in procedures utilized dedicated spiral metal test patterns formed on the surface of the entire silicon wafer. These metal patterns were photodefined with a carefully controlled geometry in order to provide electrical access to the individual chips within the wafer for purposes of both probe testing the chips for their electrical characteristics and for burning-in the chips prior to shipment of the silicon wafer to the customer for use in extended memory applications and the like. Using this latter approach, the probe test and burn-in operations are accomplished by making sequential electrical connections to a dedicated spiral metal pattern for each of the probe and burn-in steps.

There is yet another, third prior art approach to wafer scale burn-in and probe testing which has been used by Lincoln Labs and Digital Equipment Company (DEC) and which does not sacrifice valuable silicon surface area for accommodating the dedicated metallization patterns as in the case of the Anamartic approach. This third method builds up dedicated probe contact areas on top of the final layer in the integrated circuit chip processing utilizing known types of metal forming and photolithographic masking and etching techniques in order to form probe and burn-in contact areas on the integrated circuit upper surface. These latter contact areas may then be connected to test and burn-in probes for carrying out the usual and required test and burn-in procedures well known in the art. The above DEC approach has been briefly described in an article by Stan Baker entitled "DEC Goes Own Way With Packaging Technology", *Electronic Engineering Times*, Oct. 2, 1989, incorporated herein by reference.

The first of the above three prior art probe and burn-in procedures had the obvious disadvantage of requiring that separate electrical connections be made to each die or several dice or chips on the wafer for both the probe and burn-in procedures. This requirement contributes significantly to manufacturing costs and sometimes diminishes device yields because of the significant amount of wafer handling required for the large number of individual test and burn-in operations characteristic of this procedure.

Using the second of the above three prior art approaches, namely the Anamartic wafer scale and test and burn-in procedure, this procedure had the disadvantage of requiring valuable unusable dedicated silicon wafer area to support and define the dedicated spiral metallization test patterns on the surface of the integrated circuit. In addition, if the chip yield levels for a certain wafer scale application fell below a required threshold level, the entire wafer had to be destroyed. Furthermore, during probe and burn-in, the spiral patterns of metal on the silicon wafer had to be traversed by probe from the center of the wafer to the peripheral chips thereon, and this operation is very time consuming during the probe testing phase of the process.

Using the above described third prior art approach to wafer scale testing used by Lincoln Labs and Digital Equipment Company, the requirement for further building up the integrated circuits and outer insulating and dedicated test metal probe areas as part of an add-on processes in the wafer manufacturing process operated to further reduce device yields and increase wafer processing costs. As will be seen below, this procedure as well as the other two previously described prior art methods are in significant contrast to the present invention which operates to probe and burn-in the silicon wafer only after the integrated circuit manufacture is complete and without requiring these dedicated metal test areas at the final stage of the IC manufacturing process.

DISCLOSURE OF INVENTION

The general purpose and principal object of the present invention is to provide a novel alternative approach to both wafer testing and burn-in per se and also to the packaging of whole silicon wafers for use in extended memory applications and the like. The approach of the present invention operates to overcome most, if not all, of the disadvantages of the above three prior art methods of wafer testing, burn-in and wafer packaging or mounting on a chosen substrate member.

In accordance with the present method for wafer testing and burn-in per se, this method comprises the steps of first forming contacts on dice on a silicon wafer for receiving test and burn-in signals, and providing a slightly larger mating integrator substrate having a thermal expansion coefficient (TCE) equal to that of the silicon wafer. This mating integrator substrate has contacts thereon spaced in a geometrical configuration to match the geometric configuration of test and burn-in contacts on the dice. Then, the mating integrator substrate contacts are brought into physical and electrical connection with the test and burn-in contacts on the dice, and thereafter test and burn-in signals are applied to the dice contacts to complete the test and burn-in procedures. Lastly, if desired, the silicon wafer can be removed from the mating integrator substrate and diced into individual silicon chips.

In accordance with the present method for wafer scale test and burn-in as well as the subsequent wafer packaging for shipment to a customer, the above described method includes the steps of providing a mating substrate material having a temperature coefficient of expansion which matches the temperature coefficient expansion of the silicon wafer; and then leaving the mating integrator substrate and silicon wafer connected in place after probe and burn-in in face-to-face relationship and in physical and electrical contact with each other. Then, the mating integrator substrate and the silicon wafer are encapsulated in a single package using state of the art plastic encapsulation techniques to form either a full wafer or partial (cluster) wafer package suitable for shipment to the customer.

In both of the above processes, it is preferred that the mating integrator substrate and the silicon wafer have substantially matching temperature coefficients of expansion. For this reason, the mating substrate is typically fabricated of monocrystalline or polycrystalline or amorphous silicon or glass or sapphire or other similar material whose thermal expansion coefficient matches that of the silicon wafer. This feature reduces thermal stresses which are introduced into the silicon wafer during both the burn-in procedure and any subsequent temperature cycling operation. In such operation, the mating substrate is utilized to provide both mechanical support for the wafer and also to provide electrical signal paths for connecting the individual memory chips on the silicon wafer to external read/write and control circuitry and the like.

In accordance with the overall manufacturing process of the present invention including both single die and wafer scale or cluster options, a plurality of integrated circuits are initially fabricated in predefined areas on a semiconductor wafer, and then the semiconductor wafer is mated to an integrator substrate having a temperature coefficient of expansion matching that of the wafer. The integrator substrate also has interconnect contact patterns thereon or therein defining a probe test and burn-in contact pattern for the semiconductor wafer. Test and burn-in signals are applied to the integrator, and then integrated circuit yields are measured on the semiconductor wafer to determine if there are sufficient good die on the wafer to integrate the silicon wafer either fully or partially into a package for shipment. If certain maximum threshold yield requirements are met, the full wafer is maintained in contact with the integrator and encapsulated for shipment to the customer. On the other hand, if the wafer yield requirements meet only a partial or minimum threshold level, the wafer is separated from the integrator substrate and diced into clusters which are then re-aligned with a matching integrator substrate. Here the subsequent cluster attachment to the integrator substrate serves as a "partial wafer" integrator.

In accordance with a semiconductor device embodiment of the present invention, a partial or full semiconductor wafer is mated to an interconnect pattern on or within an integrator having a temperature coefficient of expansion substantially equal to the temperature coefficient expansion of the wafer. Both the integrator, interconnect pattern, and wafer are encapsulated in a single package for shipment to the customer for use in extended memory add-on applications and the like.

Accordingly, another object of this invention is to provide a new and improved probe test and burn-in method of operation of the type described which operates to maximize device yields and integrated circuit processing options.

Another object of this invention is to provide a new and improved method of testing integrated circuits which is versatile and multi-functional in that it can be compatibly used in a continuous process for manufacturing and packaging wafer scale memory arrays and the like.

Another object of this invention is to provide a new and improved manufacturing method of the type described which operates to minimize the amount of surface area on a silicon wafer required for use in the testing, burn-in and subsequent read/write operation for the memory chips on the wafer.

Another object of this invention is to provide a new and improved method of manufacture of the type described which is operative in such a manner that there is never a requirement that an entire silicon wafer be discarded in the event that threshold yield requirements for the wafer are not met for a certain wafer scale application.

A novel feature of this invention is the provision of a new and improved silicon wafer package of the type described wherein a silicon wafer having memory chips or dice therein is mounted in a novel manner on an underlying mating substrate constructed of a material having a thermal coefficient of expansion (TCE) which matches that of the silicon wafer. These two components are then encapsulated and packaged for shipment using state of the art encapsulation and related assembly techniques.

Another feature of this invention is the provision of a new and improved packaged assembly of the type described wherein the mating substrate for receiving the silicon wafer is multi-functional in that it operates to simultaneously: (1) provide mechanical support for the silicon wafer, (2) provide probe and burn-in testing of the silicon wafer, and (3) also provide electrical interconnections between individual dice within the wafer and external data access and control circuitry.

Another feature of this invention, and in significant contrast to the DEC and Lincoln Labs prior art described above, silicon wafer probe and burn-in are carried out only after integrated circuit manufacture is complete. This feature operates to reduce the amount of yield variations that occur after probe and burn-in and introduces a yield-certainty factor into the process. This feature is highly desirable in wafer scale applications having certain yield threshold requirements.

The above objects, features, and related advantages of this invention will become more readily appreciated and understood with reference to the following description of the accompanying drawings.

DETAILED DESCRIPTION OF THE PREFERRED EMBODIMENTS

Figure 1:
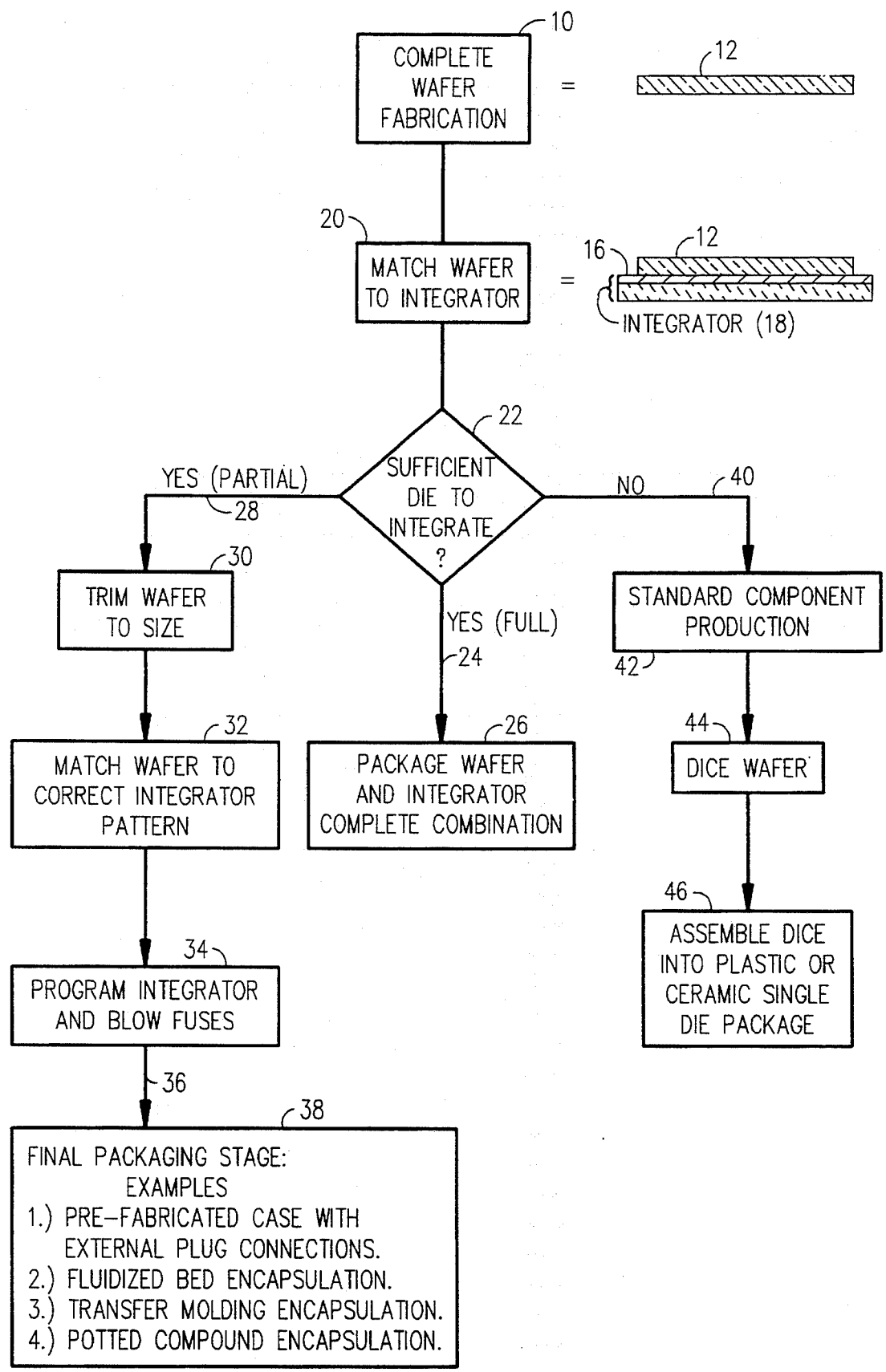
FIG. 1 is a process flow diagram and methodology illustrating the various process options made available in accordance with the present invention.

Referring now to FIG. 1, after IC wafer fabrication is completed in the initial station 10, the wafer 12 is then mated circuit and contact pattern surface down as indicated at location 14 where the contact probe and burn-in pattern (not shown) on the wafer 12 is mated with probe and burn-in contacts (also not shown) on the interconnect pattern segment 16. The interconnect pattern segment 16 in turn is contact-mated to an integrator substrate as indicated at 18, and these wafer-to-integrator connections are described in more detail below with reference to FIG. 3. This wafer-to-integrator contact matching and probe and burn-in testing is carried out in station 20 of the FIG. 1 process flow diagram. Then, the combination wafer 12, interconnect pattern 16 and integrator 18 composite structure shown in FIG. 1 is transported to a IC yield measurement station indicated at station 22 of the process flow methodology to examine the wafer 12 to determine if there are sufficient good die therein to either partially or fully integrate the wafer 12 into a wafer scale package.

If all of the die on the wafer 12 test out to be good, then the complete wafer 12 is transferred via path 24 to an assembly station 26 where the complete wafer and integrator are packaged for shipment to the customer. If, however, only a partial or fractional number of the die on the wafer test out to be good, but this number is still above the threshold yield requirement for a given wafer scale application, then the wafer 12 is removed from the integrator 18 and transported via path 28 to the station 30 where the wafer 12 is trimmed to size with all the good die thereon left intact and then matched in station 32 to the correct matching integrator pattern. The integrator 18 is then programmed in station 34 to blow the appropriate fuses on the wafer cluster remaining at station 32 for a given partial array application. The combination wafer and integrator is then transferred via path 36 to a final packaging station 38. In the final packaging station 38, the combination wafer and integrator may either be: (1) installed in a prefabricated case having external plug connections; or (2) it may be encapsulated using fluidized bed encapsulation, or (3) it may be encapsulated in a package using transfer molding encapsulation, or (4) it may be "potted" in a curable compound.

On the other hand, if the die yields do not meet certain threshold requirements for either a full or partial wafer scale application, then the wafer is separated from the integrator and transferred via path 40 to a standard component production operation as indicated at station 42, after which the wafers are diced at a conventional wafer dicing station 44. The dice are then assembled at station 46 into plastic or ceramic single die packages.

Figure 2:
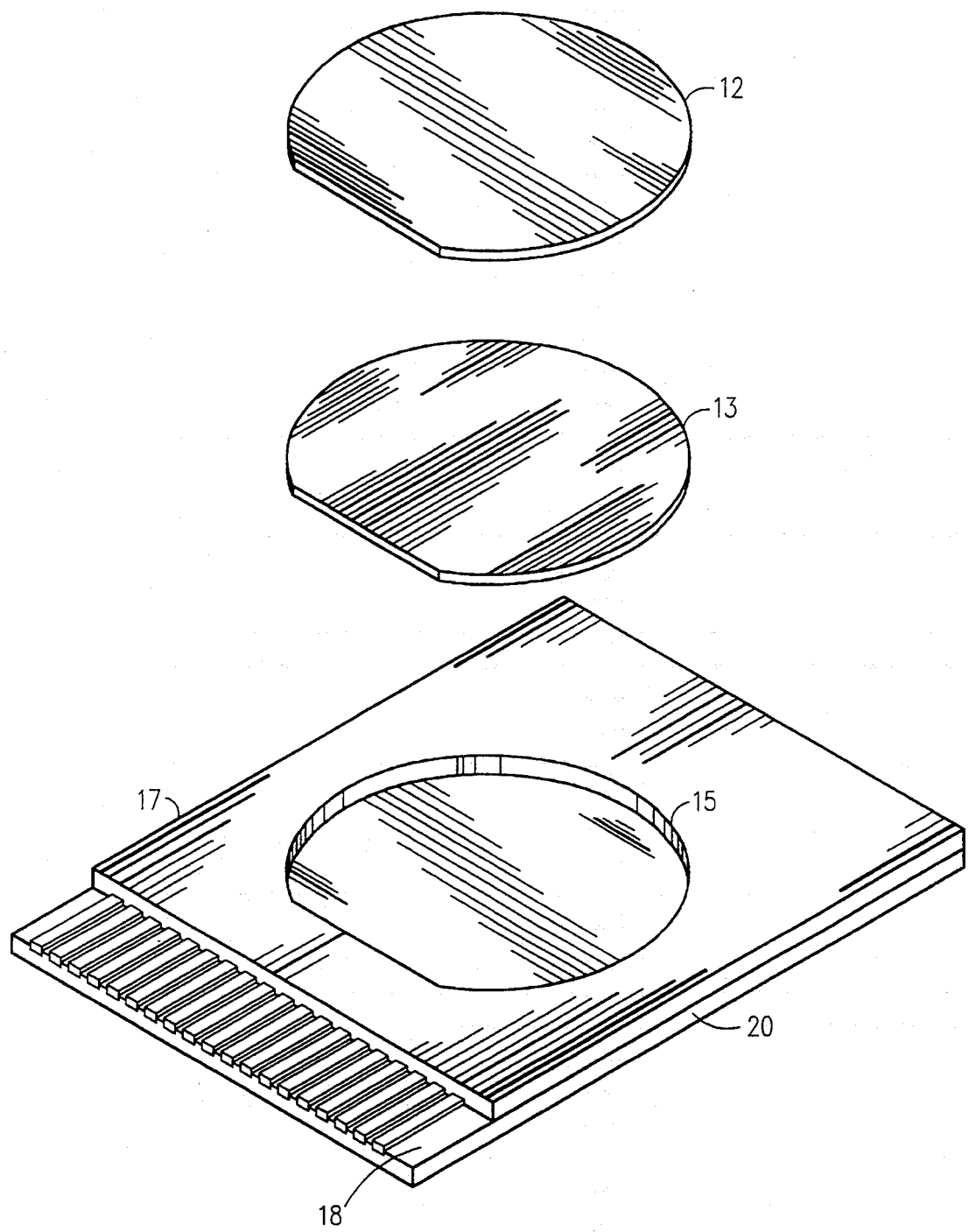
FIG. 2 is an exploded isometric view showing how the complete semiconductor wafer may be mated with and mounted on the integrator in accordance with one embodiment of the present invention using a discrete interconnect pattern between wafer and integrator.

Referring now to FIG. 2, there is shown in an exploded isometric view a discrete wafer 12 which is oriented circuit side down and facing an elastomeric Z-axis interconnect member 13. This interconnect member 13 is adapted to be positioned within the receptacle or cavity 15 in the alignment member or "aligner" device 17 which in turn is mounted on the upwardly facing surface 18 of the integrator 20. As previously indicated, the interconnect member 13 may be either a discrete element as indicated in FIG. 2, or it may be a metal or polysilicon interconnect pattern which is either integrated into the upper surface regions 18 of the integrator substrate 20 or it may alternatively be formed on top of the upper surface of the integrator substrate 20 as shown at pattern 16 in FIG. 1. Therefore, in accordance with the present invention, the interconnect pattern 13 located between the downwardly facing side or circuit side surface 14 of the wafer 12 may either be a discrete interconnect pattern, a surface deposited interconnect pattern or a wafer integrated interconnect pattern.

In the embodiment of the invention shown in FIG. 2 and using a discrete elastomeric Z-axis interconnect member 13, these elastomeric devices 13 can be of the type which have been fabricated by American Telephone and Telegraph (AT&T) and A. I. Inc. and are currently commercially available in the semiconductor manufacturing art. The AT&T process has been described in an AT&T Product Note (author unknown) entitled "Elastomeric Conductive Polymer Interconnect", Product Note PN89-050TH, pages 1–4, Copyright February 1989 AT&T, incorporated herein by reference. Also, using the AT&T Z-axis elastomeric interconnect in the above Product Note 89-050TH for the integrator 13 in FIG. 2, columns of conductive balls may be stacked vertically in this elastomeric structure in order to make electrical contact between the full or partial wafer on the top side of the elastomeric structure and an interconnect metallization pattern adjacent to the bottom side of the elastomeric structure. Advantageously, this metallization pattern may be developed on a larger ceramic substrate useful in making peripheral contacts available to the outside world for electrically accessing the full or partial wafer as previously described.

The interconnect pattern may be formed as a surface deposited layer 16 as indicated in FIG. 1 and as an integral part of the integrator 18. As for the matching TCE materials used in the fabrication of the integrator 18, these materials may be selected from the group consisting of, for example, aluminum oxide, monocrystalline silicon, amorphous glass, polycrystalline silicon, and the like.

Figure 3:
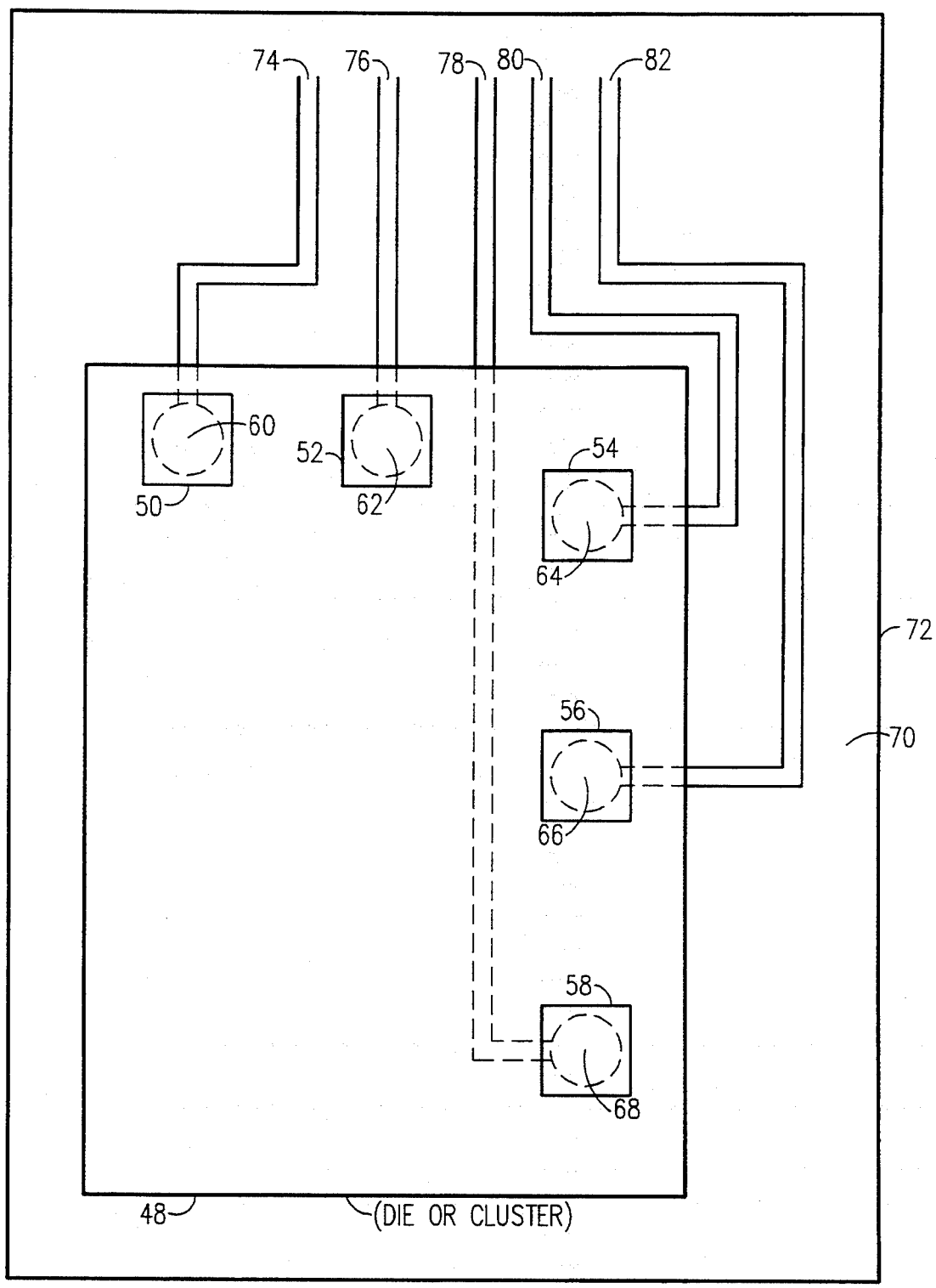
FIG. 3 is an x-ray plan view taken through the major surface of the wafer in order to show the mating electrical connections between the semiconductor die and the integrator.

Referring now to FIG. 3, there is shown a plan view as seen by an x-ray machine looking down on top of the wafer 12 of FIGS. 1 and 2 above and wherein the rectangle 48 is representative of either a single die on the wafer 12 or a cluster of dies 48 which tested out to be good and useful in the above described cluster embodiment of FIG. 2. Assuming, for example, that the rectangle 48 represents a single die, it may typically have five contact pads 50, 52, 54, 56, and 58 on the edge thereof, and these pads are shown bonded to a corresponding plurality of integrator contacts 60, 62, 64, 66, and 68 facing upwardly from the upper surface 70 of the integrator 72. Each of these integrator contacts 60, 62, 64, 66, and 68 may be formed in a conventional manner using standard IC contact bump technology, and these bumps may then be electrically connected to the outside world by way of the extended photodefined surface leads 74, 76, 78, 80, and 82 leading to the periphery of the integrator 72. This bump technology can be the standard ball type processing which has been described in the literature, including the plated bump processes used by ALCOA Industries.

An example of a typical application of the present invention to meet an extended memory requirement might include the use of a six inch diameter wafer with 4 megabits (4 millions bits per die) of storage and using approximately 150 die per wafer. In this example, the above parameters will generate a requirement of approximately 22 contacts per die, which in turn will generate a corresponding requirement of approximately 3300 contacts per integrator. Finally, in our above example the total storage capacity for this extended memory application would then be 4 megabits per die multiplied by 150 die per wafer, or 600 megabits of storage capacity for the extended memory application.

Various modifications may be made in and to the above described embodiment without departing from the spirit and scope of this invention. For example, the above identified described embodiments are not limited to the particular materials enumerated or to any combination wafer size, die storage capacity, dice per wafer or contacts per die. Furthermore, the present invention is not limited to the particular size or shape of the integrator or its number of layers or form. Accordingly, such modifications relating to precise process technology and material requirements are clearly within the scope of the following appended claims.

We claim:

1. A method for testing and burning-in dice on a silicon wafer and for packaging the wafer, which comprises the steps of:
   a. forming die contacts on said dice for receiving test and burn-in signals,
   b. forming a mating substrate out of a material having a temperature coefficient of expansion matching that of said silicon wafer, and having an interconnect pattern with contacts in a geometrical configuration matching the geometrical configuration of said die contacts on said dice,
   c. bringing said substrate contacts into physical and electrical connection with said die contacts,
   d. applying test and burn-in signals to said die contacts by way of said substrate contacts,
   e. maintaining said mating substrate and silicon wafer permanently in place after testing and burn-in of said silicon wafer,
   f. packaging said mating substrate and silicon wafer into a packaged assembly by encapsulation of said substrate and wafer with an encapsulating material, and
   g. using said wafer in memory applications with said mating substrate supporting said silicon wafer and electrically connecting said die contacts to external circuitry for providing read/write and control operations.

2. A process for probe testing and burning in a plurality of integrated circuit dice on an integrated circuit wafer and for packaging the wafer, said method comprising the steps of:
   forming a substrate out of a material having a temperature coefficient of expansion that matches a temperature coefficient of expansion of said wafer;
   forming an interconnect pattern on the substrate, said interconnect pattern including contacts in a geometrical configuration that matches a geometrical configuration of contact pads formed on the dice;
   bringing the substrate contacts into electrical communication with the contact pads on the dice;
   testing the dice by applying test and burn-in signals through the substrate interconnect pattern and contacts to the contact pads;
   following testing leaving the substrate and wafer in electrical communication;
   packaging the wafer and substrate into a packaged assembly by encapsulation of said substrate and wafer with an encapsulating material; and
   connecting the interconnect pattern of the substrate to external read/write and control circuitry for using the wafer in memory applications.

3. The method as claimed in claim 2 and wherein the substrate is formed of a material selected from the group of materials consisting of aluminum oxide, monocrystalline silicon, amorphous glass and polycrystalline silicon.

4. The method as claimed in claim 2 and wherein a Z-axis conductive pad is placed between the wafer and substrate to establish electrical communication between the contacts on the substrate and contact pads on the dice.

5. The method as claimed in claim 2 and wherein packaging is by encapsulating using a process selected from the group consisting of fluidized bed encapsulation, transfer molding encapsulation and potting with a curable compound.

* * * * *